(12) United States Patent
Lai (10) Patent No.: US 6,717,885 B2
(45) Date of Patent: Apr. 6, 2004

(54) SWITCHING CIRCUIT CAPABLE OF IMPROVING MEMORY WRITE TIMING AND METHOD THEREOF

(75) Inventor: Jiin Lai, Hsin-Tien (TW)

(73) Assignee: Via Technologies, Inc., Taipei Hsien (TW)

(*) Notice: Subject to any disclaimer, the term of this patent is extended or adjusted under 35 U.S.C. 154(b) by 8 days.

(21) Appl. No.: 10/247,664

(22) Filed: Sep. 18, 2002

(65) Prior Publication Data

US 2003/0067834 A1 Apr. 10, 2003

Related U.S. Application Data

(60) Provisional application No. 60/328,243, filed on Oct. 9, 2001.

(30) Foreign Application Priority Data

Jul. 16, 2002 (TW) ........................................ 91115764 A (51) Int. Cl.[7] ................................................. G11C 7/00
(52) U.S. Cl. .................................. 365/233; 365/189.02
(58) Field of Search ............................ 365/233, 189.02, 365/189.05, 230.02

(56) References Cited

U.S. PATENT DOCUMENTS 5,886,553 A * 3/1999 Matsui ........................ 327/166
6,445,642 B2 * 9/2002 Murakami .................... 365/233

* cited by examiner

Primary Examiner—Tan T. Nguyen
(74) Attorney, Agent, or Firm—J. C. Patents (57) ABSTRACT

In DRAM system where quad rate transmission is used, at least one latch is disposed within a switching circuit for increasing the data valid windows of a portion of transmitted data segments. For example, in a sequence of transmitted data segments, only the odd numbered segments are having their data valid windows increased. Thereby, the writing process of the system is improved. The system further provides at least one delay circuit for suitably matching signals for a desired result.

11 Claims, 8 Drawing Sheets

SWITCHING CIRCUIT CAPABLE OF IMPROVING MEMORY WRITE TIMING AND METHOD THEREOF

CROSS-REFERENCE TO RELATED APPLICATION

This application claims the priority benefit of U.S. provisional application titled "A METHOD TO IMPROVE MEMORY SYSTEM WITH QUAD-DATA-RATE TRANSFER" filed on Oct. 09, 2001, serial No. 60/328,243. All disclosures of this application is incorporated herein by reference. This application also claims the priority benefit of Taiwan application serial no. 91115764, filed Jul. 16, 2002.

BACKGROUND OF THE INVENTION

1. Field of the Invention

The present invention relates to apparatus and methods for memory systems. More specifically, the present invention relates to apparatus and methods for writing process in a memory system.

2. Description of the Background Art

Dynamic Random Access Memory (DRAM) has evolved from asynchronous DRAM to synchronous DRAM. For example, Fast-Page DRAM and Extended Data Output (EDO) DRAM have evolved to Synchronous Dynamic Random Access Memory (hereinafter abbreviated to SDRAM). Currently, high speed memory banks generally use synchronous source methods for achieving data transmission. By way of an example, Double Data Rate dynamic random access (hereinafter abbreviated to DDR SDRAM) memory bank is one of the methods. In addition, these high speed memory banks require differential signals for data transmission. Therefore, real high access speed for DRAMs requires differential signaling. It is desirous to combine source synchronization with differential signaling.

Furthermore, DRAM market tends to be outpaced in bandwidth by such elements as processor, I/O devices, or graphic add-on devices. This deficiency in bandwidth becomes especially significant for high volume data transfer applications such as Internet applications.

In order to further improve the bandwidth, schemes such as Double Data Rate (DDR), Quad Band Memory (QBM), and Quad Data Rate (QDR) are used for transmitting two or four units of data as compared to a single unit for the baseline rate. Further, the above has the advantage of using existing low-cost technology for increasing the bandwidth.

However, prior art memory systems such as QBM systems tend to have a reduced upper limit in clock frequency because of various factors such as skews between various timing signals or sequences. These skews deviate from the idealized timing sequence and limit further increases in clock frequency. Thereby a further increase in speed is rendered impractical.

As can be seen, there is a need for an improved apparatus and methods wherein memory access speed can be further increased.

SUMMARY OF THE INVENTION

In the present invention, an improvement on memory access is provided by extending the data valid window of a sequence of data segments using a latch circuit.

The present invention further improves memory access by providing a delay circuit for related timing diagrams which are otherwise not in correspondence with each other.

Accordingly, a switching circuit for improving memory writing timing sequence is provided. The switching circuit is coupled to a memory controller, a first DDR memory bank, and a second DDR memory bank. The switching circuit includes a data writing path for providing a plurality of data segments, wherein each data segment has the same valid window. The switching circuit further includes a first latch and a second latch. The first latch is disposed within the data writing path and in communication with the first DDR memory bank. The first latch extends the valid window of the odd numbered data segments of the plurality of data segments. The second latch is disposed within the data writing path and in communication with the second DDR memory bank. The second latch extends the valid window of the even numbered data segments of the plurality of data segments.

Accordingly, a switching circuit for improving memory writing timing sequence is provided. The switching circuit is coupled to and interposed between to a memory controller, a first memory bank, and a second memory bank. The switching circuit is used for transforming a first set of data segments coming from the memory controller into a second set of memory data segments. The second set of memory data segments are transmitted to the memory banks. The rate of transmission of the second set of memory data is less than the rate of transmission of the first set of memory data. The switching circuit includes a latch circuit for receiving a latching signal, wherein the latching signal is generated using a logical combination among a plurality of memory selection signals coming from the memory controller. The latching signal controls the latch circuit to hold the first set of data segments and to output the second set of memory data segments, thereby causing the data valid windows of the second set of memory data segments to be greater than the data valid windows of the first set of data segments.

Accordingly, a method for improving memory writing timing sequence is provided. The method includes the steps of receiving a plurality of data segments, wherein each data segment has the same data valid window; extending the data valid windows of the odd numbered data segments of the plurality of data segments and transmitting the same to a first memory; and extending the data valid windows of the even numbered data segments of the plurality of data segments and transmitting the same to a second memory These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Figure 1:
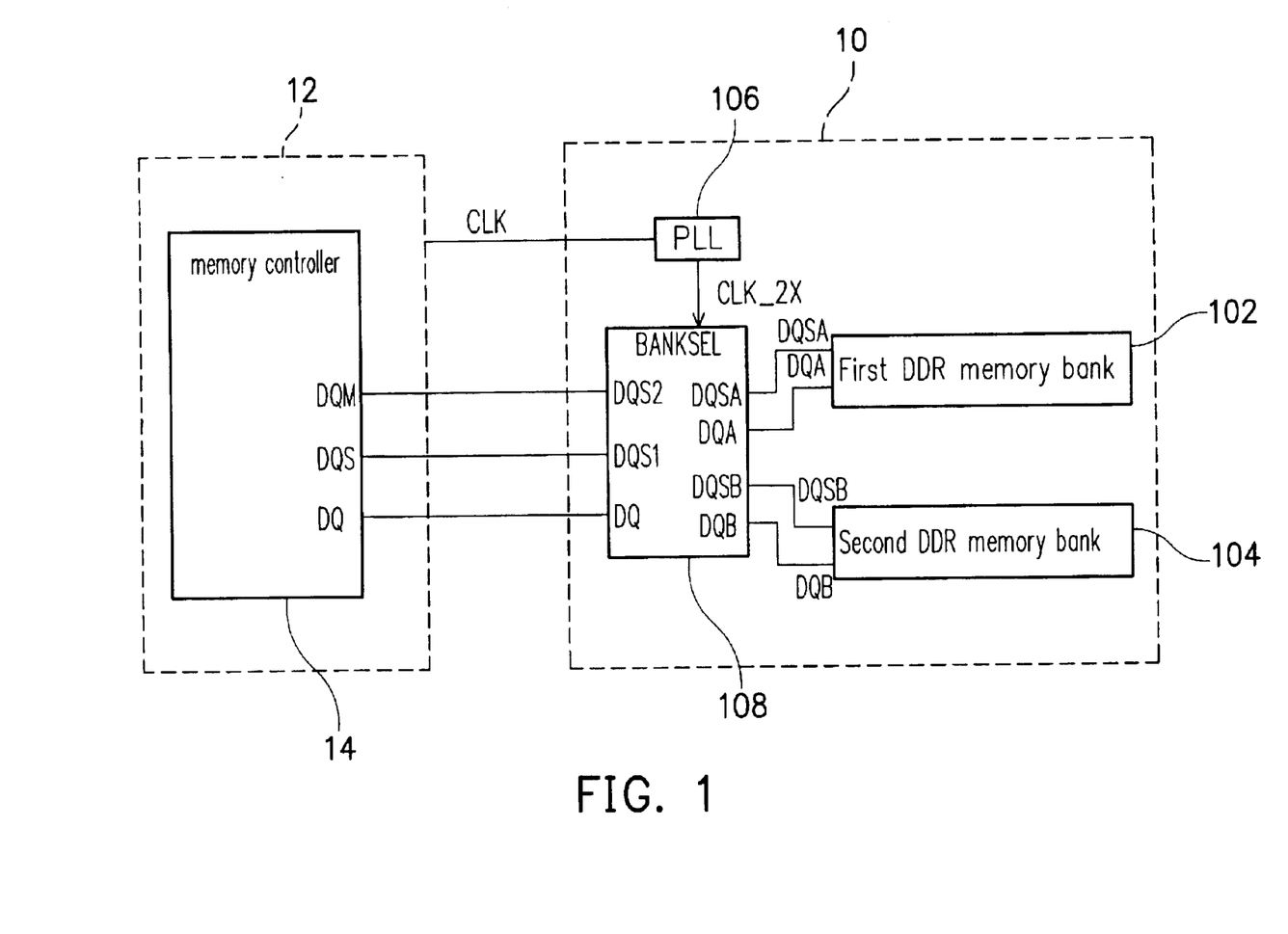
FIG. 1 depicts a block diagram of a memory system having two DDR memory banks.

Referring to FIG. 1, a structure of a Quad Band Memory (QBM) and the structure of its control chip are shown. The Quad Band Memory 10 includes a field effect transistor (hereinafter referred to as FET) switching circuit 108, a first DDR memory bank 102, a second DDR memory bank 104, and a phase locked loop (PPL) 106. As showing FIG. 1, QBM 10 is coupled to memory controller 14 of control chip 12. The data selection signal (DQS) lead and data mask (DQM) lead of the memory controller 14 are respectively coupled to the first data selection signal (DQS1) lead the second data selection signal (DQS2) lead of FET switching circuit 108. The first DDR memory bank 102 has a data selection signal (DQSA) lead and a data signal (DQA) lead. Similarly, the second DDR memory bank 104 has a data selection signal (DQSB) lead and a data signal (DQB). The above four leads are respectively coupled to FET switch circuit 108. The Quad rate data transmission is achieved by means of the QBM 10 having FET switch circuit 108 exerting a multiplexing effect by selecting between first DDR memory bank 102 and second DDR memory bank 104. The phase locked loop 106 receives memory clock (CLK) and generates a two times clock signal (CLK_2×) which possesses a frequency that is two times the frequency of CLK. The two times clock signal (CLK_2×) is used as a bank selection signal (BANKSEL) for the selection of either first DDR memory bank 102 or second DDR memory bank 104. It is noted that in FIG. 1, only the relationships between data selection signal and the data signal are shown. Other control signals may vary according to QBM specifications.

Figure 2:
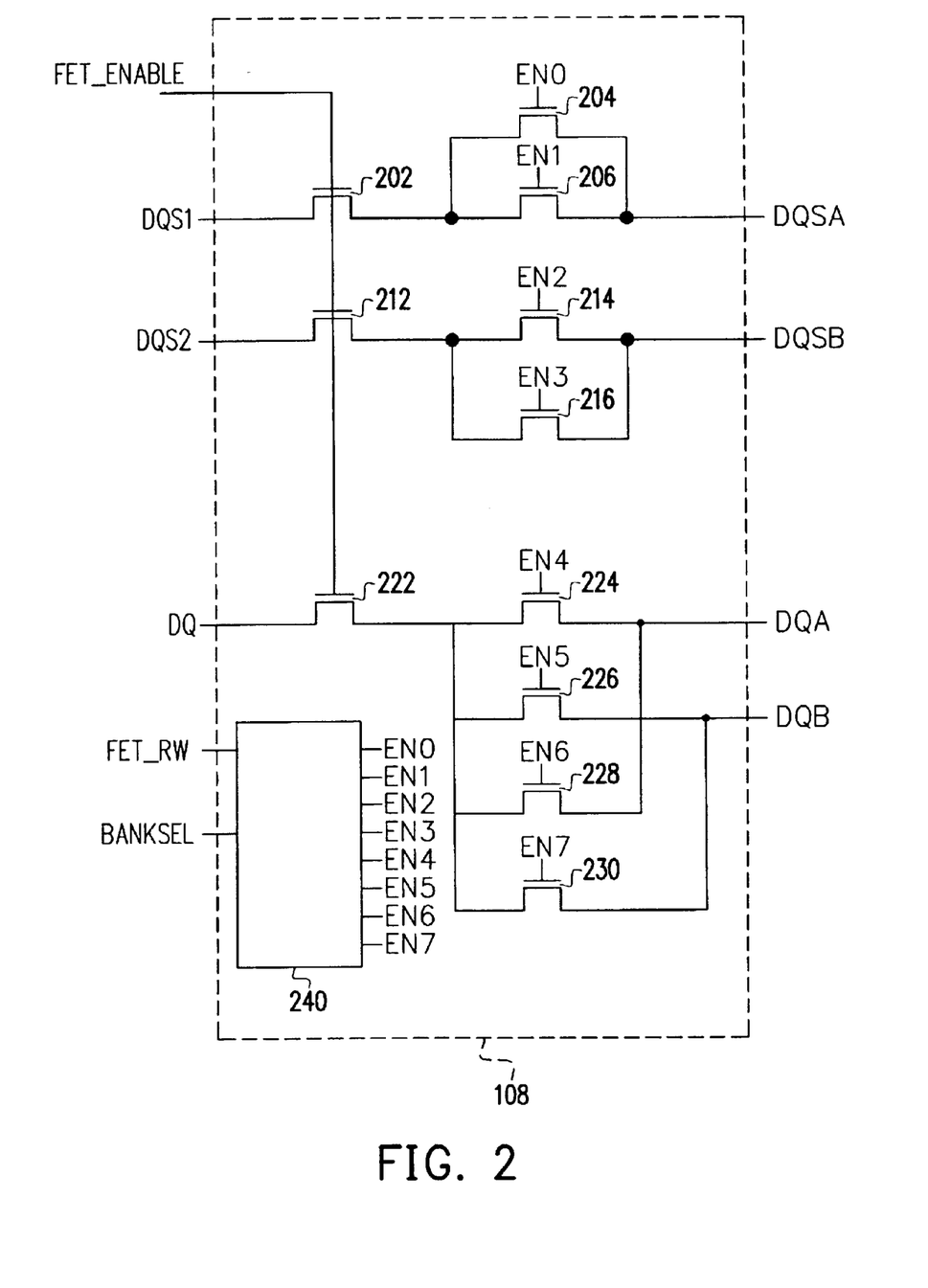
FIG. 2 depicts a block diagram of a switching circuit suitable for use in the memory system of FIG. 1.

Referring to FIG. 2, a commonly used FET switch circuit used in a QBM system is shown. The FET switch circuit 108 is coupled to the memory controller 14 of control chip 12 (see FIG. 1). FET switch circuit 108 is further coupled to first DDR memory bank 102 and second DDR memory bank 104. FET switch circuit 108 comprises a first data selection path, a second data selection path, a data reading path, a data writing path, and switch controller 240.

On the first data selection path, FET switch 202 determines its switching state according to a switching enables signal (FET-ENABLE). The parallel positioned FET switches 204 and 206 are being used as reading path and writing path respectively. FET switch 204 is controlled by EN0 and FET switch 206 is controlled by EN1. During the reading process, DQSA is capable of communicating to DQS1 via FET switch 204 and FET switch 202. During the writing process, DQS1 is capable of communicating to DQSA via FET switch 202 and FET switch 206.

On the second data selection path, FET switch 212 similarly determines its switching state according to the switching enable signal (FET-ENABLE). The parallel positioned FET switches 214 and 216 are being used as reading path and writing path respectively. FET switch 214 is controlled by EN2 and FET switch 216 is controlled by EN3. During the reading process, DQSB is capable of communicating to DQS2 via FET switch 214 and FET switch 212. During the writing process, DQS2 is capable of communicating to DQSB via FET switch 212 and FET switch 216.

On the data reading path, FET switch 222 determines its switching state according to the switching enables signal (FET-ENABLE). Two parallel positioned FET switches 224 and 226 alternatively operate for receiving data signal from to first DDR memory bank 102 and second DDR memory bank 104 respectively.

On the data writing path, switch 222 determines its switching state according to the switching enables signal (FET-ENABLE). During the writing process, two parallel positioned FET switches 228 and 230 alternatively operate, so data coming from memory controller 14 are sent to first DDR memory bank 102 and second DDR memory bank 104 respectively. The requisite data coming from memory controller 14 are latched by data selection signals of the first data selection path and the second data selection path respectively. For detailed descriptions of the latch, see descriptions of FIGS. 5–8 infra.

The operation of the switch controller 240 is further clarified according to Table 1.

TABLE 1

|         | EN0 | EN1 | EN2 | EN3 | EN4 | EN5 | EN6 | EN7 |
|---------|-----|-----|-----|-----|-----|-----|-----|-----|
| FET_RW  | 1   | 0   | 1   | 0   | 1   | 1   | 0   | 0   |
| BANKSEL | 0   | X   | 1   | X   | 0   | 1   | X   | X   |

Referring to table 1, FET_RW="1" stands for reading. FET_RW="0" stands for writing. BANKSEL is active only during reading process. During reading process, BANKSEL="1" stands for selecting the first DDR memory bank 102. Similarly, BANKSEL="0" stands for selecting the second DDR memory bank 104. EN0–EN7 are determined by FET_RW and BANKSEL. In addition, FET-Enable is set to "1" during QBM operation.

For example, during QBM reading process, FET_RW is equal to "1". EN0 and EN4 stay active when BANKSEL= "0". EN2 and EN5 stay active when BANKSEL="1". Since BANKSEL operates with a frequency of two times CLK signal (CLK_x2), data on the DQ line are acquired by BANKSEL signal selecting alternatively between data line DQA of first DDR memory bank 102 and data line DQB of second DDR memory bank 104. Because of this alternative nature, the sequence of data segments on data line DQA is defined as containing odd numbered data segments of data on DQ line. Consequently, the sequence of data segments on data line DQB is defined as containing even numbered data segments of data on DQ line.

Figure 3:
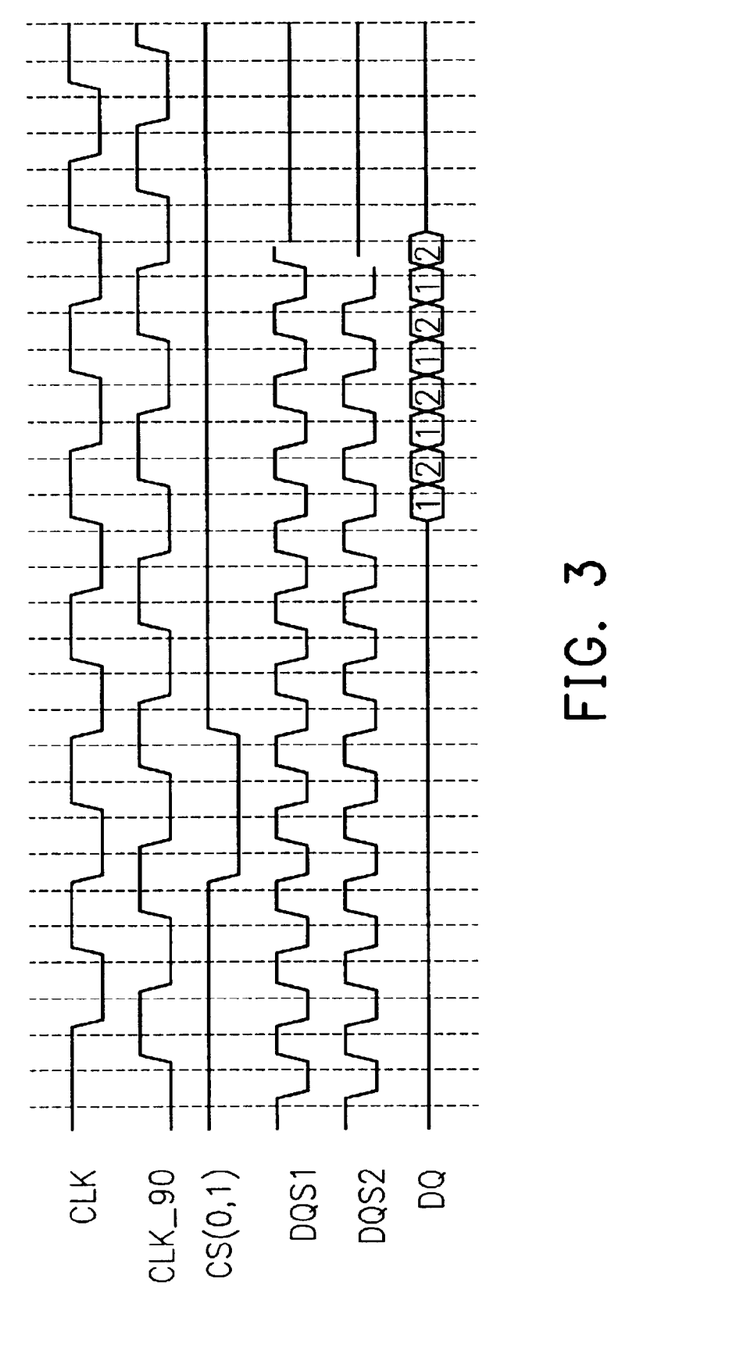
FIG. 3 is a reading process timing diagram suitable for the memory system depicted in FIGS. 1 and 2.

As shown in FIG. 3, a timing diagram for a reading process of QBM is shown. Where numeral "1" stands for the first DDR memory bank 102, and numeral "2" stands for the second DDR memory bank 104.

Figure 4:
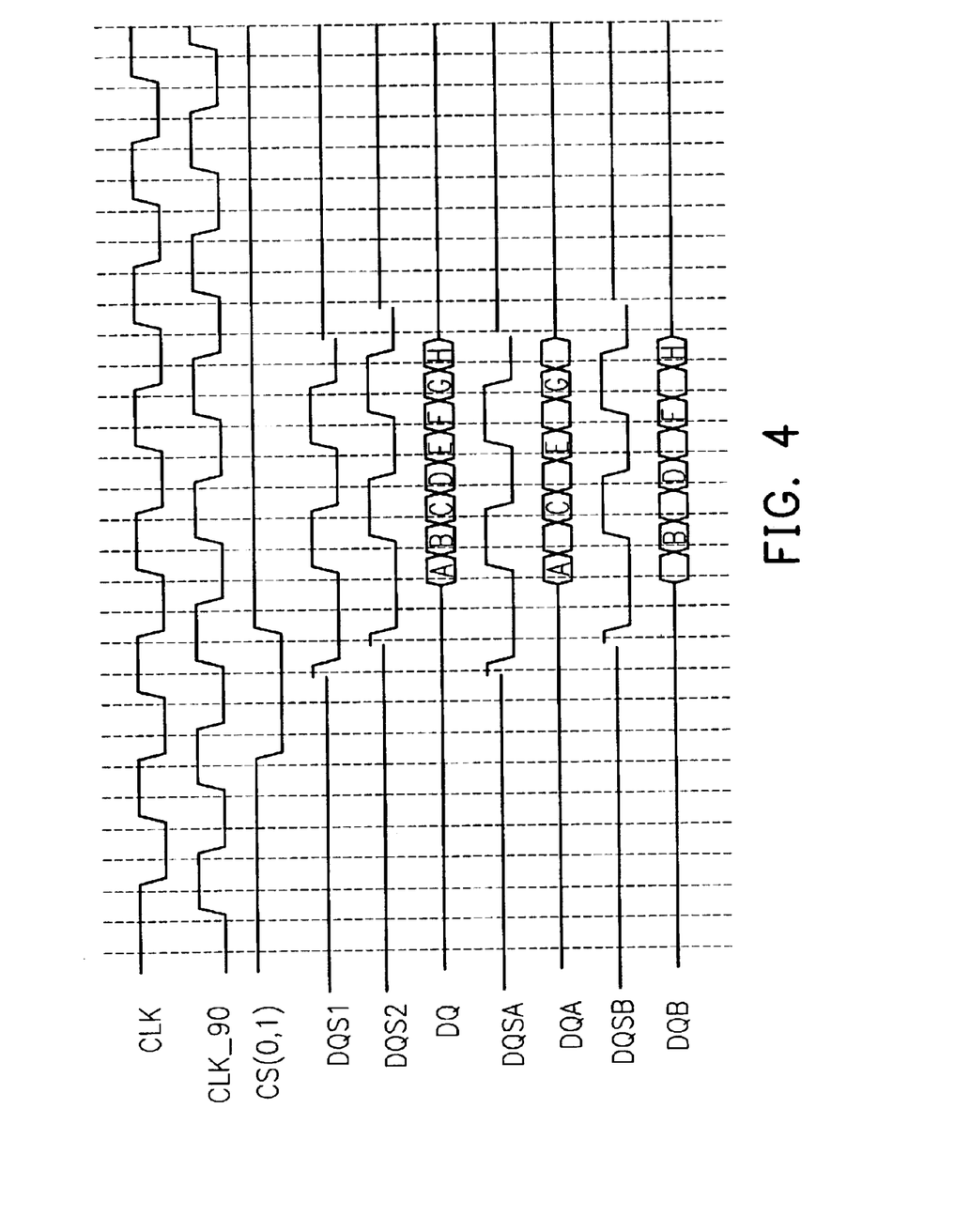
FIG. 4 is a timing diagram of a QBM writing process.

Referring to FIG. 4, the timing datagram for a QBM system during a writing process is shown. CLK denotes the clock signal. CLK_90 denotes a second clock signal having a time lag ¼T of the CLK, wherein T denotes clock cycle or period. Further, CS (0,1) denotes chip selection signal. When chip selection signal is enable, QBM initiates the writing process. At this juncture, first data selection signal DQS1 coming from DQS lead of the control chip has no phase difference with CLK. Similarly, second data selection signal DQS 2 coming from DQM lead of the control chip has no phase difference with CLK_90. Furthermore, during writing process (FET_RW="0"), FET switch circuit 108 enables EN1, EN3 EN6 EN7 to be active. As can be appreciated, DQS1 can be used as data selection signal (DQSA) of the first DDR memory bank 102, and DQS2 can be used as data selection signal (DQSB) of the second DDR memory bank 104. Therefore, data signal DQ of the control chip can operate at four times speed in transmitting data toward DQA and DQB. Because first DDR memory bank 102 latches data according to DQSA, only A, C, E, G data segments can be write onto first DDR memory bank 102.

Similarly, because second DDR memory bank 104 latches data according to DQSB, only B, D, F, H data segments can be write onto second DDR memory bank 104.

Assuming CLK possesses a period T, under optimal conditions, memory controller 14 generates data selection signal (DQS) and data signal (DQ). The data signal (DQ) has a setup time of 0.125T and a hold time of 0.125T as well. In other words, optimally the rising and falling edges of the data selection signal (DQS) are positioned at a center point of each data segment of the data signal (DQ). The effective length of a data segment is commonly known as data valid window.

During operating, data may not transmit under the optimal condition. Data may be skewed under various conditions causing phase change in data selection signal (DQS) and in data signal (DQ). For example, the above skews may include $SKEW_{controller}$, $SKEW_{traceMB}$, $SKEW_{FETswitch}$, and $SKEW_{module}$. $SKEW_{controller}$ is defined as the skew of the data selection signal DQS in relation to data signal DQ disposed at the memory controller. $SKEW_{traceMB}$ is defined as the skew of the data selection signal DQS in relation to data signal DQ disposed at the trace of motherboard (not shown). $SKEW_{FETswitch}$ is defined as the skew of the data selection signal DQS in relation to data signal DQ disposed at the FET switch circuit. And $SKEW_{module}$ is defined as the skew of the data selection signal DQS in relation to data signal DQ disposed at the memory module.

Therefore, when the first DDR memory bank 102 and the second DDR memory bank 104 respectively receive data selection signals DQSA, DQSB and data signal DQA, DQB, the phase relationship among the above can be expressed as follows:

$$0.125T - SKEW_{controller} - SKEW_{traceMB} - SKEW_{FETswitch} - SKEW_{module}$$

If the above skew expression is greater than the setup time of the first DDR memory bank 102 or the second DDR memory bank 104 respectively, then the first DDR memory bank 102 or the second DDR memory bank 104 can operate normally.

Similarly, hold time needs to be taken into consideration as well in considering the above skew expression. When QBM is in the writing process or mode, it should be noted that QBM does more than merely having a stricter quad rate being applied on the double rated (DDR) memory module. The QBM system, as compared with double data rate DDR memory, possesses an extra skew—$SKEW_{FETswitch}$. In other words, the skew of the FET switch circuit is introduced in QBM, whereas in double data rate DDR memory systems no such skew exists. As can be appreciated, for QBM systems, the writing time sequence is very tight. Therefore, when using commonly known QBM systems, there is a limit on memory access speed. Usually, when memory clock frequency reaches 100 MHz, any increase in frequency is undesirable because of the above skews.

As can be appreciated, it is desirous to improve memory writing timing sequence by means of a field effect transistor switch circuit, wherein a timing control circuit and a latch circuit is provided, thereby increasing the effective time segment (data valid window) of the received data. This way, the writing process of the memory system is improved. Embodiments of the above improvements are shown in FIGS. 5–8.

Figure 5:
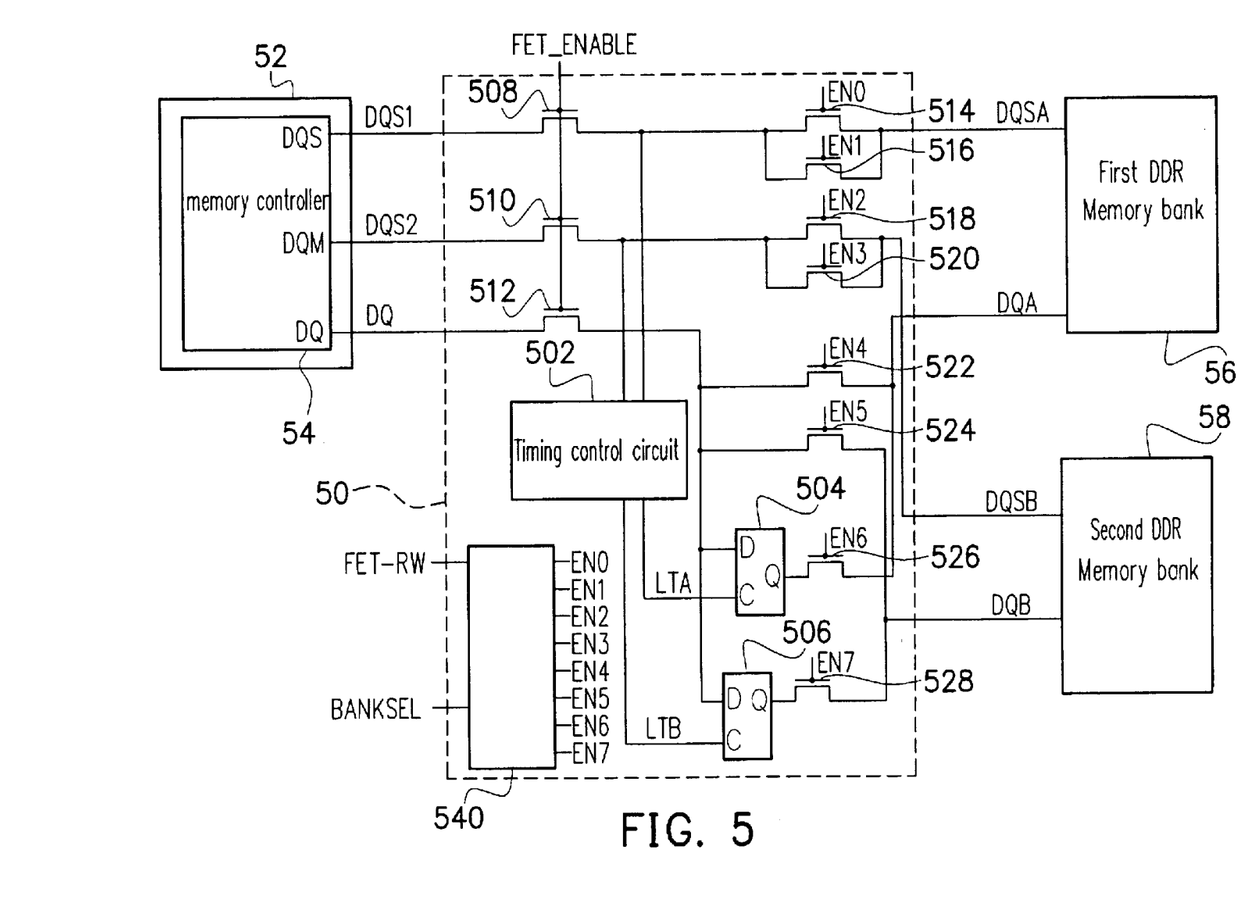
FIG. 5 is a block diagram depicting a first embodiment of the present invention.

Referring to FIG. 5, is a block diagram depicting an embodiment according to the invention for improving writing timing diagram using FET switch circuit 50. Latches 504, 506 respectively provide a hold action within the writing path of first DDR memory bank 56 and second DDR memory bank 58 of the field the effect transistor switch circuit. The latches 504, 506 are useful for the expanding the data valid window of data segments transmitted to memory banks. A timing control circuit 502 is provided for controlling latches 504, 506 according to data selection signalsDQS1, DQS2.

LTA and LTB are the timing signals of timing control circuit 502. The timing signals (LTA and LTB) are used for controlling the first latch 504 and the second latch 506 respectively. Where:

$LTA = \sim(DQS1 \char`\^ DQS2)$ $LTB = DQS1 \char`\^ DQS2$

The "~" stands for "NOT", and "^" stands for exclusive or "XOR".

Figure 6:
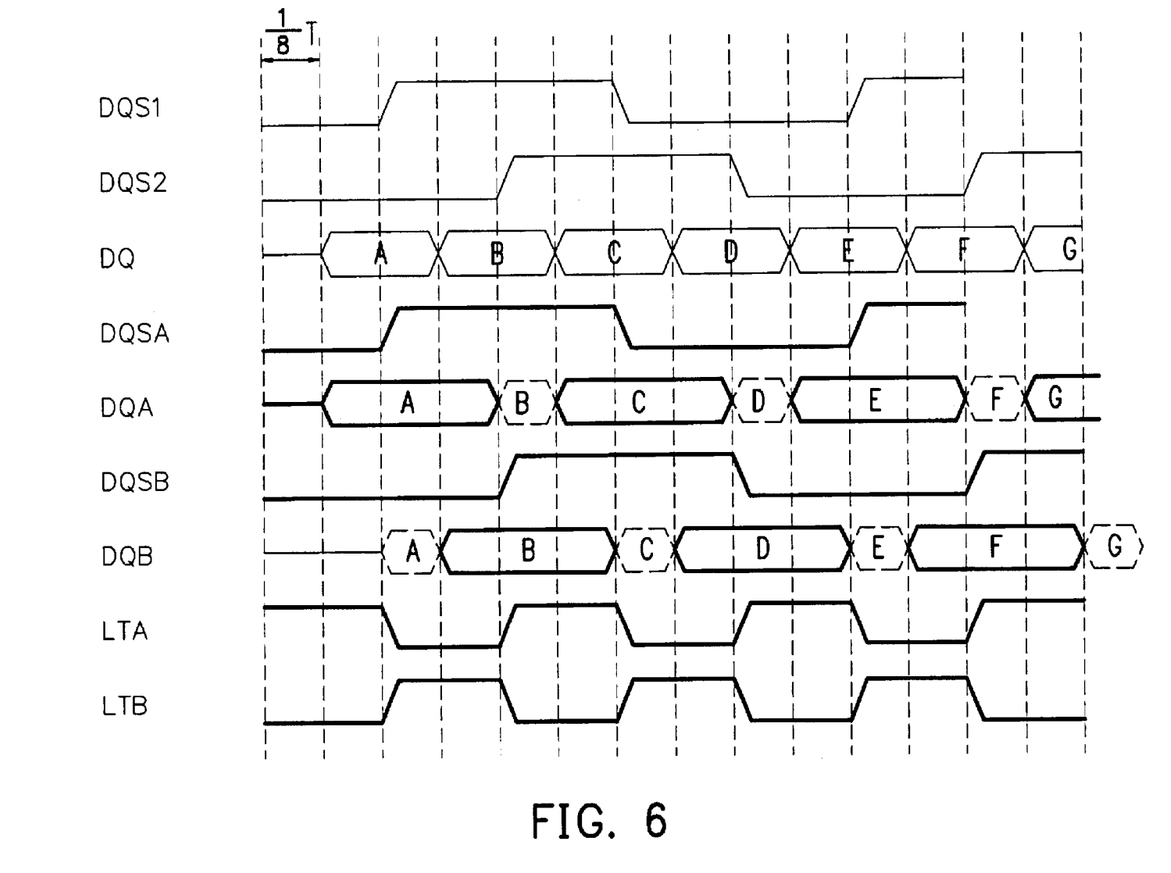
FIG. 6 is timing diagram depicting the first embodiment of the present invention.

Turning now to FIG. 6, a timing diagram of QBM of the writing process according to the invention is shown. During the writing process, the DQS lead of the control chip carries data selection signal DQS1 which is in phase with CLK. Whereas the DQM lead of the control chip carries data selection signal DQS2 which is in phase with CLK_90. In addition, during the writing process (FET_RW="0"), FET switch circuit 50 maintains EN1, EN3, EN 6, EN7 in open position. Therefore, DQS1 can act as data selection signal (DQSA) for the first DDR memory bank 56. Similarly, DQS2 can act as data selection signal (DQSB) for the second DDR memory bank 58.

By virtue of providing the latches 504, 506 in series on the writing paths respectively, the shapes of data signals DQSA and DQSB are changed.

Since LTA=~(DQS1^DQS2), when DQS1 is equal to DQS2 in value, LTA="1". And when DQS1 is not equal to DQS2, LTA="0". Latch 504 transmits data carried by DQ signal to DQA, when LTA="1". Latch 504 does not act when LTA="0" and maintains its original set of the data. Therefore, with regard to data segments "A", "C" "E", "G", latch 504 extends their data valid window respectively. With regard to data segments "B", "D", "F", their data valid windows are shortened respectively. Because first DDR memory bank 56 received data according to the first data selection signal DQS1, therefore only data segments "A", "C" "E", "G" are capable of being received by first DDR memory bank 56. As can be appreciated, by expanding the data valid windows of data segments "A", "C" "E", "G"', the boundary limit of the first DDR memory bank 56 is expanded sufficiently to accommodate a sufficiently high clock rate.

Similarly, since LTB=DQS1^DQS2, when DQS1 is not equal to DQS2 in value, LTB="1". And when DQS1 is equal to DQS2, LTB="0". Latch 506 transmits data carried by DQ signal to DQB, when LTB="1". Latch 506 does not act when LTB="0" and maintains its original set of data. Therefore, with regard to data segments "B", "D", "F", latch 506 extends their data valid window respectively. With regard to data segments ""A", "C" "E", "G", their data valid windows are shortened respectively. Because the second DDR memory bank 58 receives data according to the second the data selection signal DQS2, therefore only data segments "B", "D", "F" are capable of being received by the second DDR memory bank 58. As can be appreciated, by expanding the data valid windows of data segments ""B", "D", "F", the boundary limit of the second DDR memory bank 58 is expanded sufficiently to accommodate a sufficiently high clock rate.

As can be appreciated, the present invention provides the FET switch circuit 50 to effectively extend data valid window of data. Thereby, the memory access timing is improved for QBM.

Figure 7:
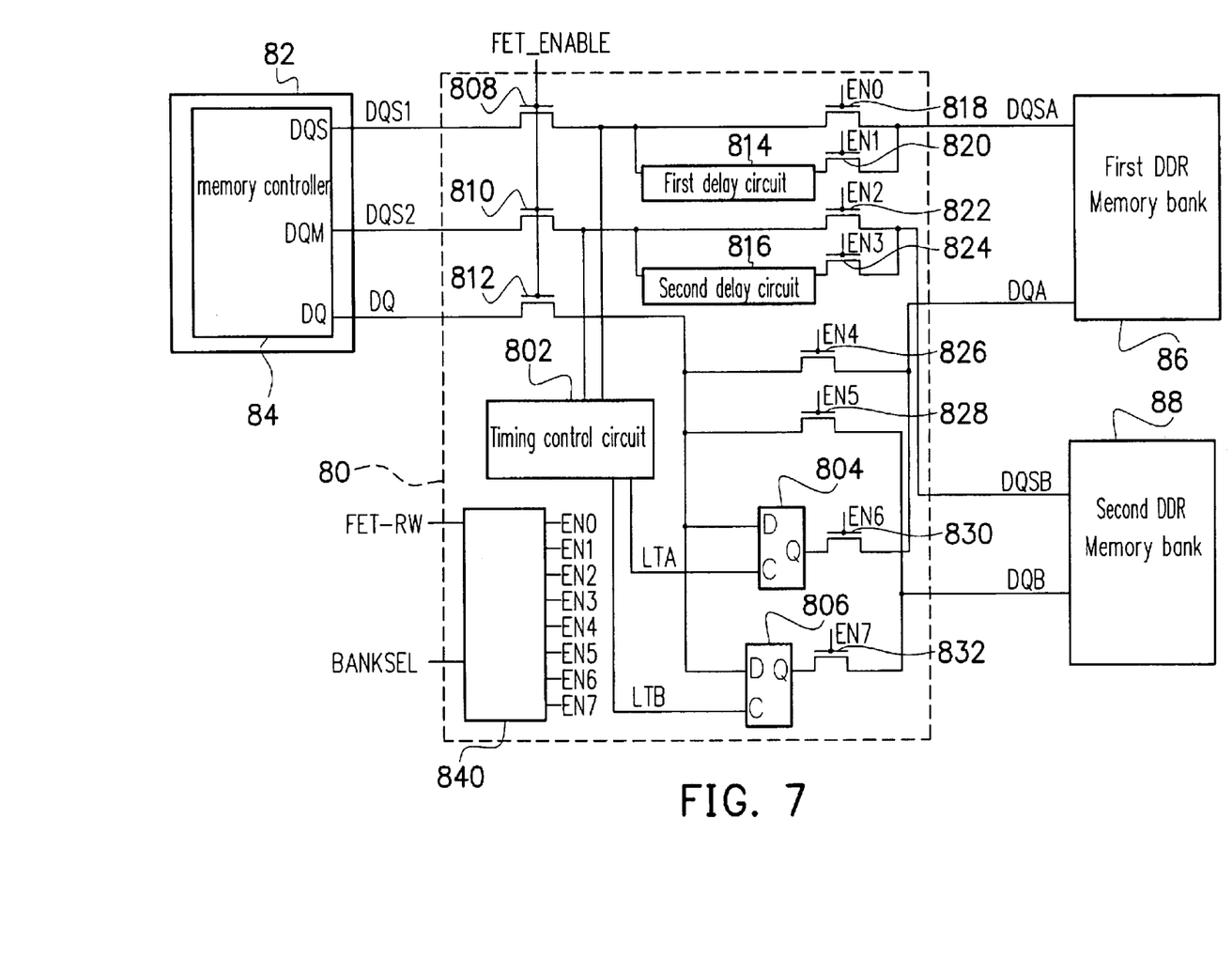
FIG. 7 is a block diagram depicting a second embodiment of the present invention.

Referring to FIG. 7, the second embodiment the present invention is shown. Compared to the first embodiment as shown in FIGS. 5 and 6, delay circuits 814, 816 are provided in series within the first data selection path and the second data selection path respectively within the FET switch circuit 80. As a result of the addition of delay circuits 814, 816, the data valid windows' center positions of the first data selection signal (DQS1) and the center positions of the second data selection signal (DQS2) can be controlled. Thereby, the boundary limit of the timing sequences is sufficiently extended.

By example, DQS1 sufficiently delays DQSA, wherein the rising edge corresponds to the center of data segment "A" of DQA. Similarly, DQS2 sufficiently delays DQSB, wherein the rising edge corresponds to the center of data segment "B" of DQB.

In the above embodiment, the delay in time or the time lag (Td) of the delay circuits 814, 816 are defined to be equal to 0.125T (Td=10125T). Where T denotes the period or cycle of CLK. Therefore, an equation corresponding to the timing of the memory writing process can be expressed as (1) From memory controller 84 to FET switch circuit 80, the following needs to be satisfied $$0.125T - SKEW_{controller} - SKEW_{traceMB} > Setup\_FET$$

Where Setup_FET denote setup time for the field effect transistor switching circuit 80.

(2) For the timing sequence from field effect transistor switching circuit 80 to the first DDR memory bank 86, the following needs to be satisfied:

$$Td - SKEW_{FETswitch} - SKEW_{module} > Setup\_DRAM$$

Where Setup_DRAM denotes DRAM set up time.

Figure 8:
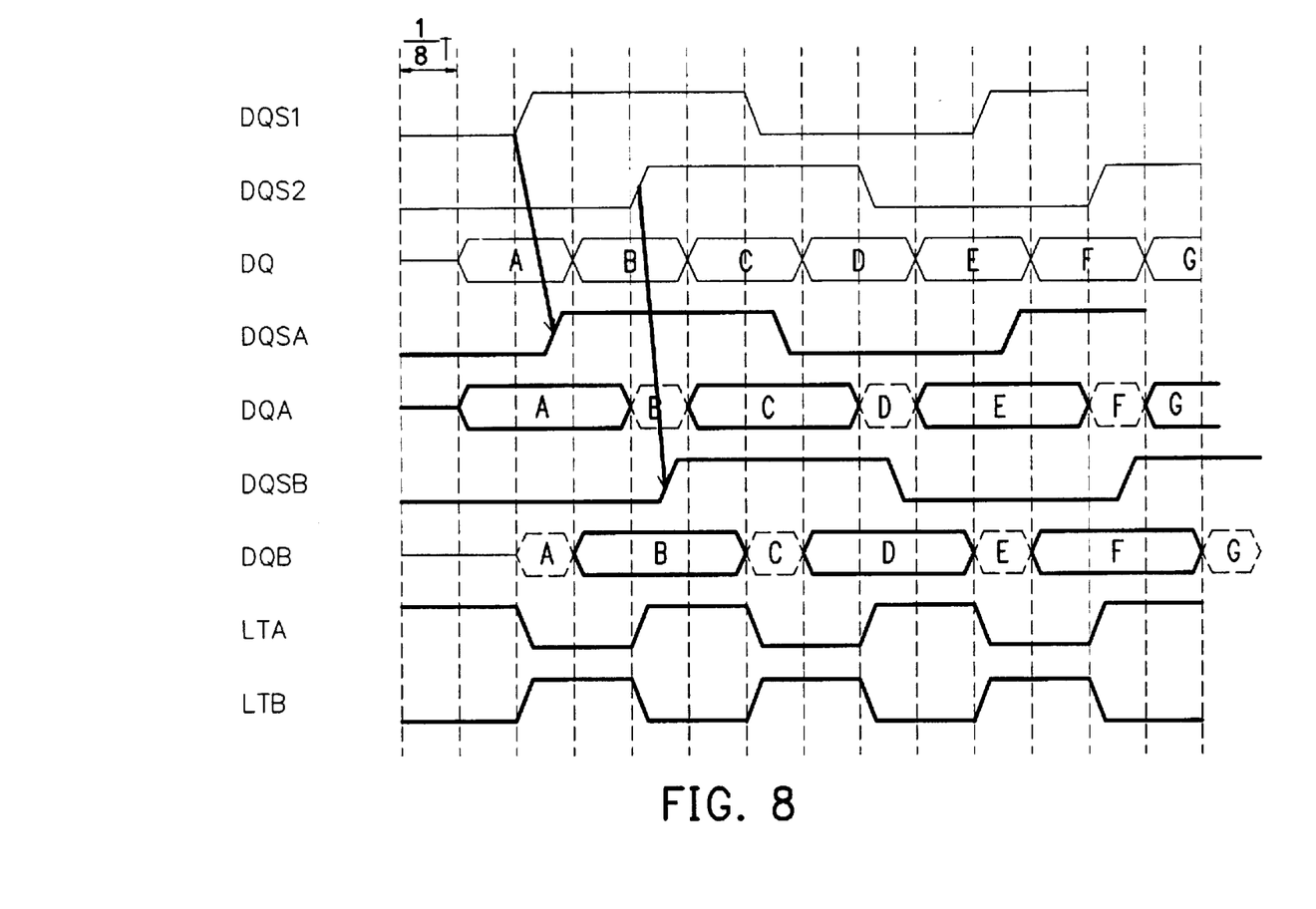
FIG. 8 is timing diagram depicting the second embodiment of the present invention.

As can be appreciated by referring to FIG. 8, by using the first delay circuit 814 and the second delay circuit 816, the timing sequence of the memory writing process can be improved.

In summary, there are at least following advantages in the invention, in which an improvement on memory access is provided by extending the data valid window of a sequence of data segments using a timing control circuit and a latch circuit. In addition, the present invention further improves memory access by providing a delay circuit for delaying data selection signals for a predetermined time lag to have an enough time margin for memory writing time.

It should be noted that the present invention utilizes FET switch circuit. However the teachings of the present invention do not necessarily limit themselves to FET switch circuit. Any suitable circuits capable of the implementing the present invention other than the FET switch circuit can be used to implement the present invention.

It is noted that with regard to the rest of the numbered elements or components of FIGS. 5 and 7, equivalents of the same are described in FIGS. 1 and 2.

It should be understood, of course, that the foregoing relates to preferred embodiments of the invention and that modifications may be made without departing from the spirit and scope of the invention as set forth in the following claims.

What is claimed is:

1. A switching circuit for improving memory writing timing sequence, the switching circuit being coupled to a memory controller, a first DDR memory bank, and a second DDR memory bank, the switching circuit comprising:

a data writing path for providing a plurality of data segments, wherein each data segment has the same valid window;

a first latch disposed within the data writing path and in communication with the first DDR memory bank, the first latch extending the valid window of the odd numbered data segments of the plurality of data segments; and a second latch disposed within the data writing path and in communication with the second DDR memory bank, the second latch extending the valid window of the even numbered data segments of the plurality of data segments.

2. The switching circuit of claim 1, further comprising:

a first data selection path for transmitting a first data selection signal to the first DDR memory bank, the first data signal originating from the memory controller; and a second data selection path for transmitting a second data selection signal to the second DDR memory bank, the second data selection signal originating from the memory controller.

3. The switching circuit of claim 2, further comprising:

a timing sequence controller for using a plurality of logical combinations of the first data selection signal and the second data selection signal to logically control the first latch and the second latch.

4. The switching circuit of claim 2, further comprising:

a first delay circuit disposed in series within the first data selection path, the first delay circuit being used for delaying the first data selection signal for a first predetermined time lag; and a second delay circuit disposed in series within the second data selection path, the second delay circuit being used for delaying the second data selection signal for a second predetermined time lag.

5. The switching circuit of claim 4, wherein the first predetermined time lag equals the second predetermined time lag.

6. A switching circuit for improving memory writing timing sequence, the switching circuit being coupled to and interposed between to a memory controller, a first memory bank, and a second memory bank, the switching circuit being used for transforming a first set of data segments coming from the memory controller into a second set of memory data segments and transmitting the second set of memory data segments to the memory banks, the rate of transmission of the second set of memory data being less than the rate of transmission of the first set of memory data, the switching circuit comprising:

a latch circuit for receiving a latching signal, wherein the latching signal is generated using a logical combination among a plurality of memory selection signals coming from the memory controller, the latching signal controlling the latch circuit to hold the first set of data segments and to output the second set of memory data segments, thereby causing the data valid windows of the second set of memory data segments to be greater than the data valid windows of the first set of data segments.

7. The switching circuit of claim 6, wherein the logical combination includes results of a timing control circuit operating according to the plurality of data selection signals.

8. The switching circuit of claim 6 further comprising a time delay circuit for delaying a data selection signal corresponding to the first set of data segments.

9. A method for improving memory writing timing sequence, the method comprising the steps of:
- receiving a plurality of data segments, wherein each data segment has the same data valid window;
- extending the data valid windows of the odd numbered data segments of the plurality of data segments and transmitting the same to a first memory; and
- extending the data valid windows of the even numbered data segments of the plurality of data segments and transmitting the same to a second memory.

10. The method of claim 9 further comprising delaying a data signal for a predetermined time segment, the data signal corresponding to the extending of data valid windows of the odd numbered data segments of the plurality of data segments and transmitting the same to a first memory.

11. The method of claim 9 further comprising delaying a data signal for a predetermined time segment, the data signal corresponding to the extending of data valid windows of the even numbered data segments of the plurality of data segments and transmitting the same to a second memory.

* * * * *